United States Patent
Lim et al.

(10) Patent No.: US 11,211,588 B2
(45) Date of Patent: Dec. 28, 2021

(54) ELECTROLUMINESCENT DISPLAY DEVICE

(71) Applicant: LG Display Co., Ltd., Seoul (KR)

(72) Inventors: Hyeongjun Lim, Paju-si (KR); Wooram Youn, Paju-si (KR); Minki Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/689,627

(22) Filed: Nov. 20, 2019

(65) Prior Publication Data

US 2020/0185650 A1    Jun. 11, 2020

(30) Foreign Application Priority Data

Dec. 7, 2018 (KR) .................. 10-2018-0156567

(51) Int. Cl.
*H01L 51/52* (2006.01)
*H01L 27/32* (2006.01)

(52) U.S. Cl.
CPC ...... *H01L 51/5265* (2013.01); *H01L 27/3246* (2013.01); *H01L 51/5209* (2013.01); *H01L 51/5218* (2013.01); *H01L 51/5234* (2013.01); *H01L 51/5256* (2013.01); *H01L 51/5271* (2013.01); *H01L 27/322* (2013.01); *H01L 27/3211* (2013.01); *H01L 51/5275* (2013.01)

(58) Field of Classification Search
None
See application file for complete search history.

(56) References Cited

U.S. PATENT DOCUMENTS

| | | |
|---|---|---|
| 2008/0138657 A1 | 6/2008 | Lee et al. |
| 2008/0296600 A1 | 12/2008 | Kwack et al. |
| 2009/0278450 A1 | 11/2009 | Sonoyama et al. |
| 2012/0205676 A1 | 8/2012 | Seo et al. |
| 2012/0218173 A1* | 8/2012 | Ohta ............. G02B 27/1046 345/76 |

(Continued)

FOREIGN PATENT DOCUMENTS

| | | |
|---|---|---|
| CN | 108122954 A | 6/2018 |
| EP | 1 930 968 A2 | 6/2008 |

(Continued)

OTHER PUBLICATIONS

Taiwanese Office Action dated Nov. 19, 2020, issued in Taiwanese Patent Application No. 10921117850.

(Continued)

*Primary Examiner* — Steven B Gauthier
(74) *Attorney, Agent, or Firm* — Morgan, Lewis & Bockius LLP

(57) ABSTRACT

An electroluminescent display device includes: a substrate, a first subpixel on the substrate, a second subpixel on the substrate, a third subpixel on the substrate, a respective first electrode in each of the first to third subpixels, an emission layer on the first electrodes, a common second electrode on the emission layer, an encapsulation layer including: a first encapsulation layer on the second electrode, and a second encapsulation layer on the first encapsulation layer, and a first semi-transmissive layer between the first encapsulation layer and the second encapsulation layer, the first semi-transmissive layer overlapping the first electrode of the first subpixel.

12 Claims, 5 Drawing Sheets

(56) References Cited

U.S. PATENT DOCUMENTS

| | | | |
|---|---|---|---|
| 2014/0103385 A1* | 4/2014 | Hatano | H01L 33/005 |
| | | | 257/99 |
| 2015/0357388 A1 | 12/2015 | Pang | |
| 2016/0043161 A1 | 2/2016 | Miyazawa | |
| 2016/0293888 A1* | 10/2016 | Shim | H01L 51/5228 |
| 2016/0329521 A1 | 11/2016 | Kim et al. | |
| 2017/0117337 A1 | 4/2017 | Kimura et al. | |
| 2017/0154930 A1 | 6/2017 | Kim et al. | |
| 2017/0352842 A1 | 12/2017 | Shiratori et al. | |
| 2018/0122868 A1 | 5/2018 | Kim et al. | |
| 2018/0151628 A1 | 5/2018 | Park | |
| 2018/0182823 A1* | 6/2018 | Ito | H01L 51/5237 |
| 2018/0190740 A1 | 7/2018 | Bang et al. | |
| 2019/0157360 A1 | 5/2019 | Tsukamoto et al. | |
| 2019/0229152 A1* | 7/2019 | Wang | H01L 51/5206 |

FOREIGN PATENT DOCUMENTS

| | | |
|---|---|---|
| EP | 3 343 662 A1 | 7/2018 |
| JP | 2007-165214 A | 6/2007 |
| JP | 2009-272150 A | 11/2009 |
| JP | 2011-165621 A | 8/2011 |
| JP | 2014-082132 A | 5/2014 |
| JP | 2015-062194 A | 4/2015 |
| JP | 2017-083517 A | 5/2017 |
| JP | 2017-103226 A | 6/2017 |
| JP | 2017-220452 A | 12/2017 |
| KR | 10-2012-0004163 A | 1/2012 |
| KR | 10-2016-0132190 A | 11/2016 |
| KR | 10-2017-0108294 A | 9/2017 |
| TW | 2013-03818 A | 1/2013 |
| WO | 2018/021196 A1 | 2/2018 |

OTHER PUBLICATIONS

Japanese Office Action dated Nov. 16, 2020, issued in Japanese Patent Application No. 2019-215150.

Office Action dated Jul. 13, 2021, issued in Japanese Patent Application No. 2019-215150.

\* cited by examiner

ELECTROLUMINESCENT DISPLAY DEVICE

CROSS-REFERENCE TO RELATED APPLICATION(S)

This application claims the benefit of and priority to Korean Patent Application No. 10-2018-0156567, filed on Dec. 7, 2018, the entirety of which is hereby incorporated by reference.

BACKGROUND

1. Technical Field

The present disclosure relates to an electroluminescent display device.

2. Discussion of the Related Art

An electroluminescent display device is provided such that an emission layer is provided between an anode electrode and a cathode electrode, and the emission layer emits light by an electric field generated between the above two electrodes, to thereby display an image. The emission layer may be formed of an organic material, which emits light when an exciton is produced by a bond of electron and hole, and the exciton falls to a ground state from an excited state, or may be formed of an inorganic material, such as a quantum dot.

In the related art, the anode electrode is formed of a reflective electrode, and the cathode electrode is formed of a semi-transmissive electrode, whereby a micro-cavity effect is obtained by repetitive reflection and re-reflection of the light between the anode electrode and the cathode electrode. However, to obtain the micro-cavity effect, a distance between the anode electrode and the cathode electrode, e.g., a thickness of the emission layer, should be optimized. For example, it has limitations in providing an organic emitting layer for emitting predetermined colored light at a position enabling optimization of a charge balance in the emission layer. For example, in the related art, it is difficult to optimize both the micro-cavity effect and the charge balance.

SUMMARY

Accordingly, the present disclosure is directed to an electroluminescent display device that substantially obviates one or more of the issues due to limitations and disadvantages of the related art.

An aspect of the present disclosure is to provide an electroluminescent display device capable of improving or optimizing both of a micro-cavity effect and a charge balance.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided an electroluminescent display device, including: a substrate, a first subpixel on the substrate, a second subpixel on the substrate, a third subpixel on the substrate, a respective first electrode in each of the first to third subpixels, an emission layer on the first electrodes, a common second electrode on the emission layer, an encapsulation layer including: a first encapsulation layer on the second electrode, and a second encapsulation layer on the first encapsulation layer, and a first semi-transmissive layer between the first encapsulation layer and the second encapsulation layer, the first semi-transmissive layer overlapping the first electrode of the first subpixel.

In another aspect, there is provided an electroluminescent display device including: a substrate, a first subpixel on the substrate, a second subpixel on the substrate, and a third subpixel on the substrate, a first reflective electrode provided in the first subpixel, a second reflective electrode in the second subpixel on the substrate, a third reflective electrode in the third subpixel on the substrate, an emission layer on the first reflective electrode, the second reflective electrode, and the third reflective electrode, a transparent electrode on the emission layer, a plurality of encapsulation layers on the transparent electrode, a first semi-transmissive layer between any two among the plurality of encapsulation layers, the first semi-transmissive layer overlapping the first reflective electrode, a second semi-transmissive layer between any two among the plurality of encapsulation layers, the second semi-transmissive layer overlapping the second reflective electrode, and a third semi-transmissive layer between any two among the plurality of encapsulation layers, the third semi-transmissive layer overlapping the third reflective electrode.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that may be included to provide a further understanding of the disclosure and are incorporated in and constitute a part of this disclosure, illustrate embodiments of the disclosure and together with the description serve to explain various principles of the disclosure.

Figure 1:
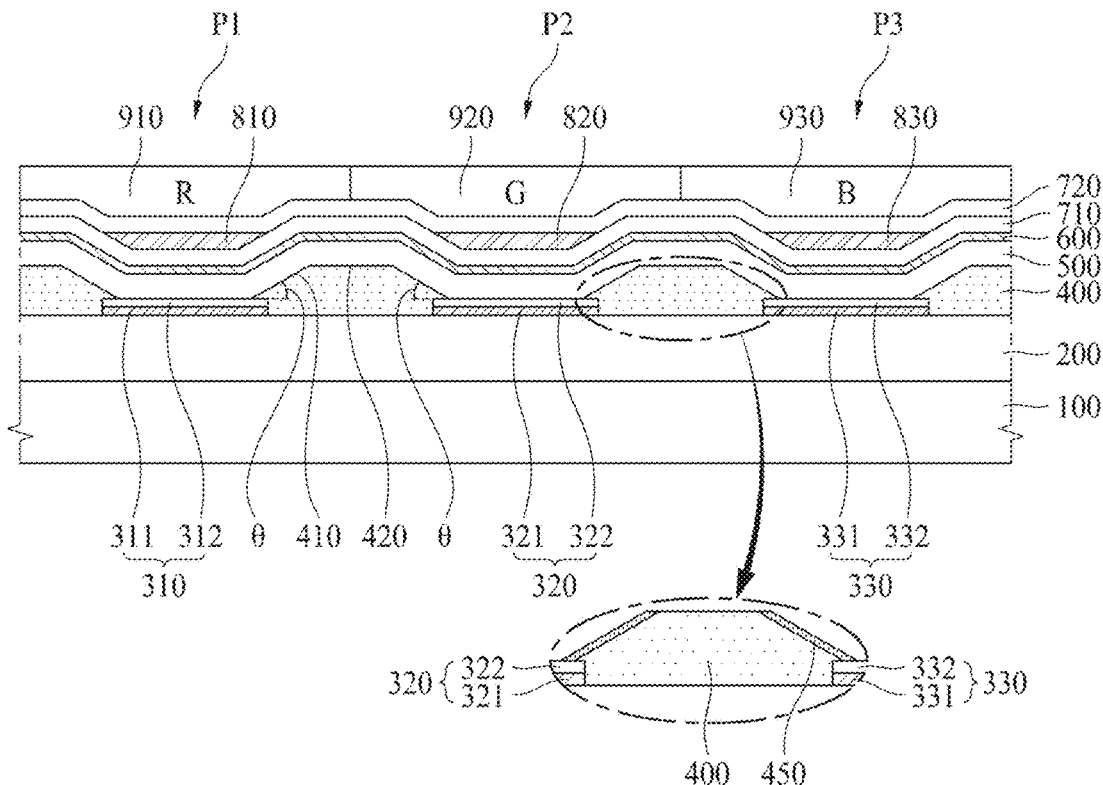
FIG. 1 is a cross-sectional view illustrating an electroluminescent display device according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the present disclosure is only defined by scopes of claims.

A shape, a size, a ratio, an angle, and a number disclosed in the drawings for describing embodiments of the present disclosure are merely an example. Thus, the present disclosure is not limited to the illustrated details. Like reference numerals refer to like elements throughout. In the following description, when the detailed description of the relevant known function or configuration is determined to unnecessarily obscure an important point of the present disclosure, the detailed description of such known function or configuration may be omitted. When terms "include," "have," and "include" described in the present disclosure are used, another part may be added unless a more limiting term, such as "only," is used. The terms of a singular form may include plural forms unless referred to the contrary.

In construing an element, the element is construed as including an error or tolerance range even where no explicit description of such an error or tolerance range. In describing a position relationship, when a position relation between two parts is described as, for example, "on," "over," "under," or "next," one or more other parts may be disposed between the two parts unless a more limiting term, such as "just" or "direct(ly)," is used. In describing a time relationship, when the temporal order is described as, for example, "after," "subsequent," "next," or "before," a case that is not continuous may be included, unless a more limiting term, such as "just," "immediate(ly)," or "direct(ly)," is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms like "first," "second," "A," "B," "(a)," and "(b)" may be used. These terms are merely for differentiating one element from another element, and the essence, sequence, order, or number of a corresponding element should not be limited by the terms. Also, when an element or layer is described as being "connected," "coupled," or "adhered" to another element or layer, the element or layer can not only be directly connected or adhered to that other element or layer, but also be indirectly connected or adhered to the other element or layer with one or more intervening elements or layers "disposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning for example consistent with their meaning in the context of the relevant art and should not be interpreted in an idealized or overly formal sense unless expressly so defined herein.

Hereinafter, example embodiments of the present disclosure will be described in detail with reference to the accompanying drawings.

FIG. 1 is a cross-sectional view illustrating an electroluminescent display device according to an embodiment of the present disclosure.

As shown in the example of FIG. 1, the electroluminescent display device according to an embodiment of the present disclosure may include a substrate 100, a circuit device layer 200, a first electrode 310, 320, and 330, a bank 400, an emission layer 500, a second electrode 600, an encapsulation layer 710 and 720, a semi-transmissive layer 810, 820, and 830, and a color filter layer 910, 920, and 930. The substrate 100 may be formed of glass or plastic, but is not limited to these materials. The substrate 100 may be formed of a semiconductor material, such as a silicon wafer. The substrate 100 may be formed of a transparent material or an opaque material. On the substrate 100, there may be a first subpixel (P1), a second subpixel (P2), and a third subpixel (P3). The first subpixel (P1) may emit red (R) light, the second subpixel (P2) may emit green (G) light, and the third subpixel (P3) may emit blue (B) light, but are not limited to this structure. For example, an arrangement order of the respective subpixels (P1, P2, P3) may be changed in various ways.

The electroluminescent display device according to an embodiment of the present disclosure may be formed as a top-emission type in which emitted light advances upwardly, but is not limited to this type. When the electroluminescent display device is formed in the top-emission type, the first substrate 100 may be formed of an opaque material, as well as a transparent material.

The circuit device layer 200 may be provided on the substrate 100. In the circuit device layer 200, a circuit device, including various signal lines, thin-film transistors and a capacitor, may be provided for each subpixel (P1, P2, P3). The signal lines may include a gate line, a data line, a power line, and a reference line, and the thin-film transistors may include a switching thin-film transistor, a driving thin-film transistor, and a sensing thin-film transistor.

The switching thin-film transistor may be switched by a gate signal supplied to the gate line, and the switching thin-film transistor may supply a data voltage, which may be supplied from the data line, to the driving thin-film transistor. The driving thin-film transistor may be switched by the data voltage supplied from the switching thin-film transistor, and the driving thin-film transistor may generate a data current from power source supplied from the power line, and may supply the data current to the first electrode 310, 320, and 330.

The sensing thin-film transistor may sense a deviation of threshold voltage in the driving thin-film transistor, which may cause a deterioration of picture quality. The sensing thin-film transistor may supply a current of the driving thin-film transistor to the reference line in response to a sensing control signal supplied from the gate line or an additional sensing line.

The capacitor may maintain the data voltage supplied to the driving thin-film transistor for one frame period. The capacitor may be connected to each of gate and source terminals of the driving thin-film transistor.

The first electrode 310, 320, and 330 may be connected to the driving thin-film transistor provided in the circuit device layer 200. For example, the first electrode 310, 320, and 330 may be connected to the source terminal or drain terminal of the driving thin-film transistor through a contact hole provided in the circuit device layer 200.

The first electrode 310, 320, and 330 may be patterned for each subpixel (P1, P2, P3) on the circuit device layer 200. One of the first electrode 310 may be formed in the first subpixel (P1), another first electrode 320 may be formed in the second subpixel (P2), and another first electrode 330 may be formed in the third subpixel (P3).

The first electrode 310 of the first subpixel (P1) may include a first reflective electrode 311 and a first transparent electrode 312. The first transparent electrode 312 may be provided on an upper surface of the first reflective electrode 311, and the first reflective electrode 311 and the first transparent electrode 312 may be electrically connected to each other. The first reflective electrode 311 may upwardly reflect light emitted from the emission layer 500 of the first subpixel (P1), and the first transparent electrode 312 may function as an anode for generating a hole in the first subpixel (P1).

The first electrode 320 of the second subpixel (P2) may include a second reflective electrode 321 and a second transparent electrode 322. The second transparent electrode 322 may be provided on an upper surface of the second reflective electrode 321, and the second reflective electrode 321 and the second transparent electrode 322 may be electrically connected to each other. The second reflective electrode 321 may upwardly reflect light emitted from the emission layer 500 of the second subpixel (P2), and the second transparent electrode 322 may function as an anode for generating a hole in the second subpixel (P2).

The first electrode 330 of the third subpixel (P3) may include a third reflective electrode 331 and a third transparent electrode 332. The third transparent electrode 332 may be provided on an upper surface of the third reflective electrode 331, and the third reflective electrode 331 and the third transparent electrode 332 may be electrically connected to each other. The third reflective electrode 331 may upwardly reflect light emitted from the emission layer 500 of the third subpixel (P3), and the third transparent electrode 332 may function as an anode for generating a hole in the third subpixel (P3).

The bank 400 may cover the end of the first electrode 310, 320, and 330 on the circuit device layer 200. Accordingly, it may be possible to reduce or prevent a current from being concentrated into the end of the first electrode 310, 320, and 330, to reduce or prevent a deterioration of an emission efficiency.

The bank 400 may be formed as a matrix configuration in the boundary between each of the plurality of subpixels (P1, P2, P3), and may be configured to define an emission area in each individual subpixel (P1, P2, P3). For example, an exposed area of the first electrode 310, 320, and 330, which may be exposed without being covered by the bank 400 in each subpixel (P1, P2, P3), may become the emission area.

The bank 400 may include a lateral surface 410 in contact with each subpixel (P1, P2, P3), and an upper surface 420 extending from the lateral surface 410. For example, the bank 400 may be provided such that the lateral surface 410 may be inclined at a predetermined angle (θ) with respect to an upper surface of the substrate 100, and the light emitted from the emission layer 500 of each subpixel (P1, P2, P3) may be refracted on the lateral surface 410. Thus, it may be possible to reduce or prevent the light emitted from the emission layer 500 of each subpixel (P1, P2, P3) from being mixed together between the neighboring subpixels (P1, P2, P3).

For example, a refractive index of the bank 400 may be smaller than a refractive index of the emission layer 500 to make the light emitted from the emission layer 500 of each subpixel (P1, P2, P3) be easily refracted on the lateral surface 410 of the bank 400. Also, an angle (θ) between the lateral surface 410 of the bank 400 and the upper surface of the substrate 100 may be within a range from, e.g., about 30° to 80°.

Also, as shown in an expanded view of an arrow, a reflective layer 450 may be additionally provided in the lateral surface 410 of the bank 400. For example, the light emitted from the emission layer 500 of each subpixel (P1, P2, P3) may be refracted on the reflective layer 450, and may be reduced or prevented from being mixed with light of the neighboring subpixel between the neighboring subpixels (P1, P2, P3), which may improve a luminance of the electroluminescent display device. Although not shown, the reflective layer 450 may extend to the upper surface 420 of the bank 400.

The emission layer 500 may be formed on the first electrode 310, 320, and 330. The emission layer 500 may be formed on the bank 400. For example, the emission layer 500 may be formed in each subpixel (P1, P2, P3) and the boundary area between the subpixels (P1, P2, P3).

The emission layer 500 may be configured to emit white (W) light. For example, the emission layer 500 may include a plurality of stacks configured to emit different-colored light. For example, the emission layer 500 may include a first stack ($1^{st}$ stack) configured to emit first-colored light, a second stack ($2^{nd}$ stack) configured to emit second-colored light, and a charge generating layer (CGL) disposed between the first stack and the second stack. The first stack ($1^{st}$ stack) may be formed in a deposition structure obtained by sequentially depositing a hole injecting layer, a hole transporting layer, a blue organic emitting layer, and an electron transporting layer, which may be sequentially provided on the first electrode 310, 320, and 330, but is not limited to this structure. The second stack ($2^{nd}$ stack) may be formed in a deposition structure obtained by sequentially depositing a hole transporting layer, a yellow-green organic emitting layer, an electron transporting layer, and an electron injecting layer, which may be sequentially provided on the charge generating layer (CGL), but is not limited to this structure.

If desired, the emission layer 500 may include a first stack ($1^{st}$ stack) configured to emit blue light, a second stack ($2^{nd}$ stack) configured to emit green light, a third stack ($3^{rd}$ stack) configured to emit red light, a first charge generating layer disposed between the first stack and the second stack, and a second charge generating layer disposed between the second stack and the third stack.

The second electrode 600 may be formed on the emission layer 500. The second electrode 600 may function as a cathode of the electroluminescent display device. Similarly to the emission layer 500, the second electrode 600 may be formed in each subpixel (P1, P2, P3), and the boundary area between the subpixels (P1, P2, P3). For example, the second electrode 600 may be formed above the bank 400.

As the electroluminescent display device according to an embodiment of the present disclosure may be formed as the top-emission type, the second electrode 600 may be formed of the transparent electrode. The transparent electrode may be capable of upwardly transmitting the light emitted from the emission layer 500.

The encapsulation layer 710 and 720 may be formed on the second electrode 600 to reduce or prevent external moisture from permeating into the emission layer 500. The encapsulation layer 710 and 720 may include a first encapsulation layer 710 formed on an upper surface of the second electrode 600, and a second encapsulation layer 720 formed on an upper surface of the first encapsulation layer 710. Each of the first encapsulation layer 710 and the second encapsulation layer 720 may be formed of an inorganic insulating material, but are not limited thereto. For example, each of the first encapsulation layer 710 and the second encapsulation layer 720 may be formed of an organic insulating material The semi-transmissive layer 810, 820, and 830 may be disposed between the first encapsulation layer 710 and the second encapsulation layer 720. In the area that overlaps the semi-transmissive layer 810, 820, and 830, an upper surface of the first encapsulation layer 710 may be in contact with a lower surface of the semi-transmissive layer 810, 820, and 830, and a lower surface of the second encapsulation layer 720 may be in contact with an upper surface of the semi-transmissive layer 810, 820, and 830. Also, in the area that does not overlap the semi-transmissive layer 810, 820, and 830, an upper surface of the first encapsulation layer 710 may be in contact with a lower surface of the second encapsulation layer 720.

The semi-transmissive layer 810, 820, and 830 may include a first semi-transmissive layer 810 patterned in the first subpixel (P1), a second semi-transmissive layer 820 patterned in the second subpixel (P2), and a third semi-transmissive layer 830 patterned in the third subpixel (P3). The first semi-transmissive layer 810 may overlap the first electrode 310 of the first subpixel (P1), the second semi-transmissive layer 820 may overlap the first electrode 320 of the second subpixel (P2), and the third semi-transmissive layer 830 may overlap the first electrode 330 of the third subpixel (P3).

The semi-transmissive layer 810, 820, and 830 may be formed of a material capable of partially transmitting some light, and reflecting the remaining light. The semi-transmissive layer 810, 820, and 830 may realize a micro-cavity effect per each individual subpixel (P1, P2, P3). For example, the micro-cavity effect may be obtained by repetitive reflection and re-reflection of the light between the semi-transmissive layer 810, 820, and 830, and the reflective electrode 311, 321, and 331 of the first electrode 310, 320, and 330. For example, the reflection and re-reflection of the light may be repeated between the first semi-transmissive layer 810 and the first reflective electrode 311 in the first subpixel (P1), the reflection and re-reflection of the light may be repeated between the second semi-transmissive layer 820 and the second reflective electrode 321 in the second subpixel (P2), and the reflection and re-reflection of the light may be repeated between the third semi-transmissive layer 830 and the third reflective electrode 331 in the third subpixel (P3).

Generally, in the related art, the second electrode 600 may be formed of a semi-transmissive material, and the micro-cavity effect may be obtained by repetitive reflection and re-reflection of the light between the reflective electrode 311, 321, and 331 of the first electrode 310, 320, and 330 and the second electrode 600. For example, to obtain the micro-cavity effect, an interval between the second electrode 600 and the reflective electrode 311, 321, and 331 of the first electrode 310, 320, and 330 has to be adjusted appropriately. For example, an entire thickness of the emission layer 500 has to be set appropriately. However, if the entire thickness of the emission layer 500 is set in consideration of only the micro-cavity effect, it has a limitation on an optimal position of the blue or yellow organic emitting layer in the emission layer 500 to improve or optimize a charge balance for improvement of exciton formation efficiency.

Meanwhile, according to an embodiment of the present disclosure, the micro-cavity effect may be obtained by repetitive reflection and re-reflection of the light between the semi-transmissive layer 810, 820, and 830 and the reflective electrode 311, 321, and 331 of the first electrode 310, 320, and 330. Thus, the micro-cavity effect may be obtained by appropriately setting a thickness of the first encapsulation layer 710 and a thickness of the second electrode 600 in addition to the entire thickness of the emission layer 500.

Thus, according to an embodiment of the present disclosure, the entire thickness of the emission layer 500 may be set to provide the blue or yellow-green organic emitting layer in the emission layer 500 at the position capable of improving or optimizing the charge balance, and furthermore improving the exciton formation efficiency. Thus, the thickness of the second electrode 600 and the thickness of the first encapsulation layer 710 may be optimally set for realizing the micro-cavity effect in consideration of the preset entire thickness of the emission layer 500.

As a result, in the related art, it may be difficult to improve both the micro-cavity effect and the exciton formation efficiency. Meanwhile, according to an embodiment of the present disclosure, the semi-transmissive layer 810, 820, and 830 may be additionally provided so that it may be possible to improve both the micro-cavity effect and the exciton formation efficiency.

Meanwhile, the first semi-transmissive layer 810, the second semi-transmissive layer 820, and the third semi-transmissive layer 830 may be provided at fixed intervals. For example, the first semi-transmissive layer 810, the second semi-transmissive layer 820, and the third semi-transmissive layer 830 may be spaced apart from each other in the boundary area between the subpixels (P1, P2, P3) overlapping the bank 400. For example, the first semi-transmissive layer 810, the second semi-transmissive layer 820, and the third semi-transmissive layer 830 may be not formed in the boundary area between the subpixels (P1, P2, P3).

Accordingly, the first semi-transmissive layer 810, the second semi-transmissive layer 820, and the third semi-transmissive layer 830 may be spaced apart from each other in the boundary area between the subpixels (P1, P2, P3) so that it may be possible to reduce or prevent the light emitted from the emission layer 500 of each subpixel (P1, P2, P3) from being reflected on the boundary area between the subpixels (P1, P2, P3) and being advanced to the neighboring subpixel (P1, P2, P3), to thereby reduce a problem related with the mixture of colored light between the subpixels (P1, P2, P3).

To reduce or prevent mixture of color between the subpixels (P1, P2, P3), for example, the first semi-transmissive layer 810, the second semi-transmissive layer 820, and the third semi-transmissive layer 830 may not overlap the upper surface 420 of the bank 400, but embodiments are not limited thereto. When the first semi-transmissive layer 810, the second semi-transmissive layer 820, and the third semi-transmissive layer 830 do not overlap the upper surface 420 of the bank 400, the upper surface of the first encapsulation layer 710 may be in contact with the lower surface of the second encapsulation layer 720 in the area overlapping the upper surface 420 of the bank 400.

The semi-transmissive layer 810, 820, and 830 may be provided to realize the micro-cavity effect, and the semi-transmissive layer 810, 820, and 830 may not function as an electrode for a light emission of the emission layer 500. Thus, the semi-transmissive layer 810, 820, and 830 may be formed of a non-conductive material, but embodiments are not limited thereto. For example, the semi-transmissive layer 810, 820, and 830 may be formed of a conductive material.

The color filter layer 910, 920, and 930 may be formed on the encapsulation layer 710 and 720. For example, the color filter layer 910, 920, and 930 may be formed on an upper surface of the second encapsulation layer 720. The color filter layer 910, 920, and 930 may include a first color filter layer 910 provided in the first subpixel (P1), a second color filter layer 920 provided in the second subpixel (P2), and a third color filter layer 930 provided in the third subpixel (P3).

The first color filter layer 910 may overlap the first semi-transmissive layer 810, the second color filter layer 920 may overlap the second semi-transmissive layer 820, and the third color filter layer 930 may overlap the third semi-transmissive layer 830. The first color filter layer 910 may be formed of a red (R) color filter layer, the second color filter layer 920 may be formed of a green (G) color filter layer, and the third color filter layer 930 may be formed of a blue (B) color filter layer.

Figure 2:
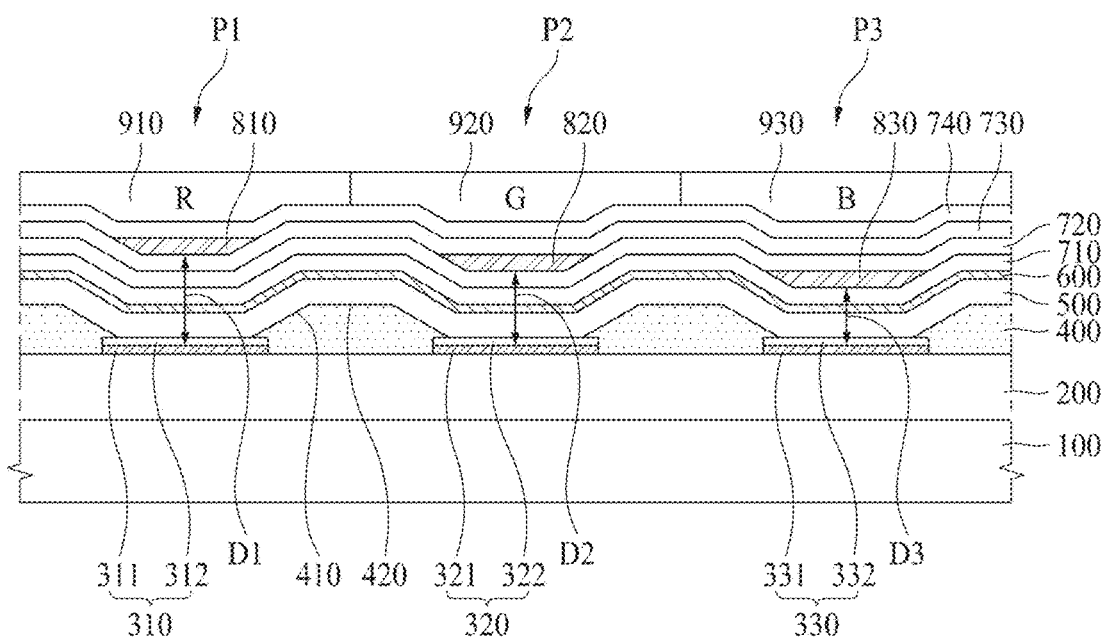
FIG. 2 is a cross-sectional view illustrating an electroluminescent display device according to another embodiment of the present disclosure.

FIG. 2 is a cross-sectional view illustrating an electroluminescent display device according to another embodiment of the present disclosure.

Except for a structure of a semi-transmissive layer 810, 820, and 830 and an encapsulation layer 710, 720, 730, and 740, the electroluminescent display device of FIG. 2 is substantially similar to the electroluminescent display device of FIG. 1. Accordingly, the same reference numbers will be used throughout the drawings to refer to the same or like parts, and only the different structures will be described as follows.

As shown in the example of FIG. 2, the encapsulation layer 710, 720, 730, and 740 may include a first encapsulation layer 710 formed on a second electrode 600, a second encapsulation layer 720 formed on the first encapsulation layer 710, a third encapsulation layer 730 formed on the second encapsulation layer 720, and a fourth encapsulation layer 740 formed on the third encapsulation layer 730. The semi-transmissive layer 810, 820, and 830 may include a first semi-transmissive layer 810 patterned in a first subpixel (P1), a second semi-transmissive layer 820 patterned in a second subpixel (P2), and a third semi-transmissive layer 830 patterned in a third subpixel (P3). The first semi-transmissive layer 810 may be formed between the third encapsulation layer 730 and the fourth encapsulation layer 740, the second semi-transmissive layer 820 may be formed between the second encapsulation layer 720 and the third encapsulation layer 730, and the third semi-transmissive layer 830 may be formed between the first encapsulation layer 710 and the second encapsulation layer 720.

Accordingly, in the area overlapping the first semi-transmissive layer 810, an upper surface of the first encapsulation layer 710 may be in contact with a lower surface of the second encapsulation layer 720, an upper surface of the second encapsulation layer 720 may be in contact with a lower surface of the third encapsulation layer 730, an upper surface of the third encapsulation layer 730 may be in contact with a lower surface of the first semi-transmissive layer 810, and a lower surface of the fourth encapsulation layer 740 may be in contact with an upper surface of the first semi-transmissive layer 810. Also, in the area overlapping the second semi-transmissive layer 820, an upper surface of the first encapsulation layer 710 may be in contact with a lower surface of the second encapsulation layer 720, an upper surface of the second encapsulation layer 720 may be in contact with a lower surface of the first semi-transmissive layer 810, a lower surface of the third encapsulation layer 730 may be in contact with an upper surface of the first semi-transmissive layer 810, and an upper surface of the third encapsulation layer 730 may be in contact with a lower surface of the fourth encapsulation layer 740.

Also, in the area overlapping the third semi-transmissive layer 830, an upper surface of the first encapsulation layer 710 may be in contact with a lower surface of the first semi-transmissive layer 810, a lower surface of the second encapsulation layer 720 may be in contact with an upper surface of the first semi-transmissive layer 810, an upper surface of the second encapsulation layer 720 may be in contact with a lower surface of the third encapsulation layer 730, and an upper surface of the third encapsulation layer 730 may be in contact with a lower surface of the fourth encapsulation layer 740. Also, in the area not overlapping the semi-transmissive layer 810, 820, and 830, an upper surface of the first encapsulation layer 710 may be in contact with a lower surface of the second encapsulation layer 720, an upper surface of the second encapsulation layer 720 may be in contact with a lower surface of the third encapsulation layer 730, and an upper surface of the third encapsulation layer 730 may be in contact with a lower surface of the fourth encapsulation layer 740.

Thus, according to another embodiment of the present disclosure, the first semi-transmissive layer 810, the second semi-transmissive layer 820, and the third semi-transmissive layer 830 may be formed in different layers, and thus, may be positioned at the different heights. As such, a first distance (D1) between the first semi-transmissive layer 810 and the first reflective electrode 311, a second distance (D2) between the second semi-transmissive layer 820 and the second reflective electrode 321, and a third distance (D3) between the third semi-transmissive layer 830 and the third reflective electrode 331 may be different from one another. Accordingly, it may be possible to realize the micro-cavity effect for each individual subpixel (P1, P2, P3).

For example, when the reflection and re-reflection of the light are repeated between the semi-transmissive layer 810, 820, and 830 and the reflective electrode 311, 321, and 331, when a distance between the semi-transmissive layer 810, 820, and 830 and the reflective electrode 311, 321, and 331 becomes an integer multiple of half-wavelength ($\lambda/2$) of light with a predetermined wavelength, a constructive interference may occur, to thereby improve an external extraction efficiency of light. Thus, to improve the external extraction efficiency of the light with a predetermined wavelength, the distance between the semi-transmissive layer 810, 820, and 830 and the reflective electrode 311, 321, and 331 may have to be differently set for each individual subpixel (P1, P2, P3) so that the distance between the semi-transmissive layer 810, 820, and 830 and the reflective electrode 311, 321, and 331 becomes the integer multiple of half-wavelength ($\lambda/2$) of light with a predetermined wavelength.

According to another embodiment of the present disclosure, the first semi-transmissive layer 810, the second semi-transmissive layer 820, and the third semi-transmissive layer 830 may be positioned at the different heights, and the first distance (D1) between the first semi-transmissive layer 810 and the first reflective electrode 311, the second distance (D2) between the second semi-transmissive layer 820 and the second reflective electrode 321, and the third distance (D3) between the third semi-transmissive layer 830 and the third reflective electrode 331 may be different from one another. For example, the thickness of the first encapsulation layer 710, the thickness of the second encapsulation layer 720, and the thickness of the third encapsulation layer 730 may be set appropriately so that the first distance (D1), the second distance (D2), and the third distance (D3) may be set to be the integer multiple of half-wavelength ($\lambda/2$) of light by each subpixel (P1, P2, P3).

For example, the first distance (D1) between the first semi-transmissive layer 810 and the first reflective electrode 311 may be the largest in the first subpixel (P1) configured to emit red (R) light with a long wavelength, and the third distance (D3) between the third semi-transmissive layer 830 and the third reflective electrode 331 may be the smallest in the third subpixel (P3) configured to emit blue (B) light with a short wavelength. However, because the integer multiple of half-wavelength ($\lambda/2$) of light with a predetermined wavelength may be changed to be once, double, or triple for each subpixel (P1, P2, P3), it may be unnecessary to make the first distance (D1) be the largest in the first subpixel (P1) for emitting the red (R) light with the long wavelength.

Figure 3:
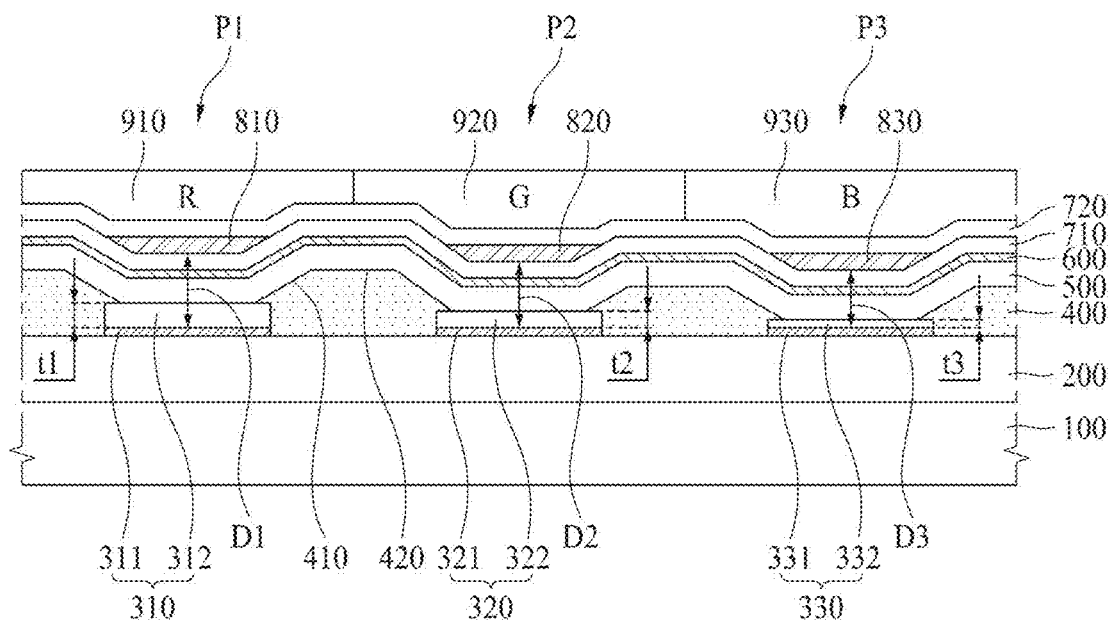
FIG. 3 is a cross-sectional view illustrating an electroluminescent display device according to another embodiment of the present disclosure.

FIG. 3 is a cross-sectional view illustrating an electroluminescent display device according to another embodiment of the present disclosure.

Except for a structure of a reflective electrode 311, 321, and 331, the electroluminescent display device of FIG. 3 is substantially similar to the electroluminescent display device of FIG. 1. Accordingly, the same reference numbers will be used throughout the drawings to refer to the same or like parts, and only the different structures will be described as follows.

As shown in the example of FIG. 3, a first reflective electrode 311 may have a first thickness (t1), a second reflective electrode 321 may have a second thickness (t2), and a third reflective electrode 331 may have a third thickness (t3). For example, the first thickness (t1), the second thickness (t2), and the third thickness (t3) may be different from one another. For example, the first thickness (t1) may be the largest, the second thickness (t2) may be middle, and the third thickness (t3) may be the smallest.

Accordingly, a first distance (D1) between the first reflective electrode 311 and a first semi-transmissive layer 810, a second distance (D2) between the second reflective electrode 321 and a second semi-transmissive layer 820, and a third distance (D3) between the third reflective electrode 331 and a third semi-transmissive layer 830 may be different from one another. Thus, it may be possible to obtain a micro-cavity effect for each individual subpixel (P1, P2, P3), as described above with reference to FIG. 2. Although not shown, a structure of semi-transmissive layers 810, 820, and 830 and a structure of encapsulation layers 710 and 720 in the structure of FIG. 3 may be changed to be the same as those of the semi-transmissive layers 810, 820, and 830 and encapsulation layer 710, 720, 730, and 740 in the structure of FIG. 2.

Figure 4:
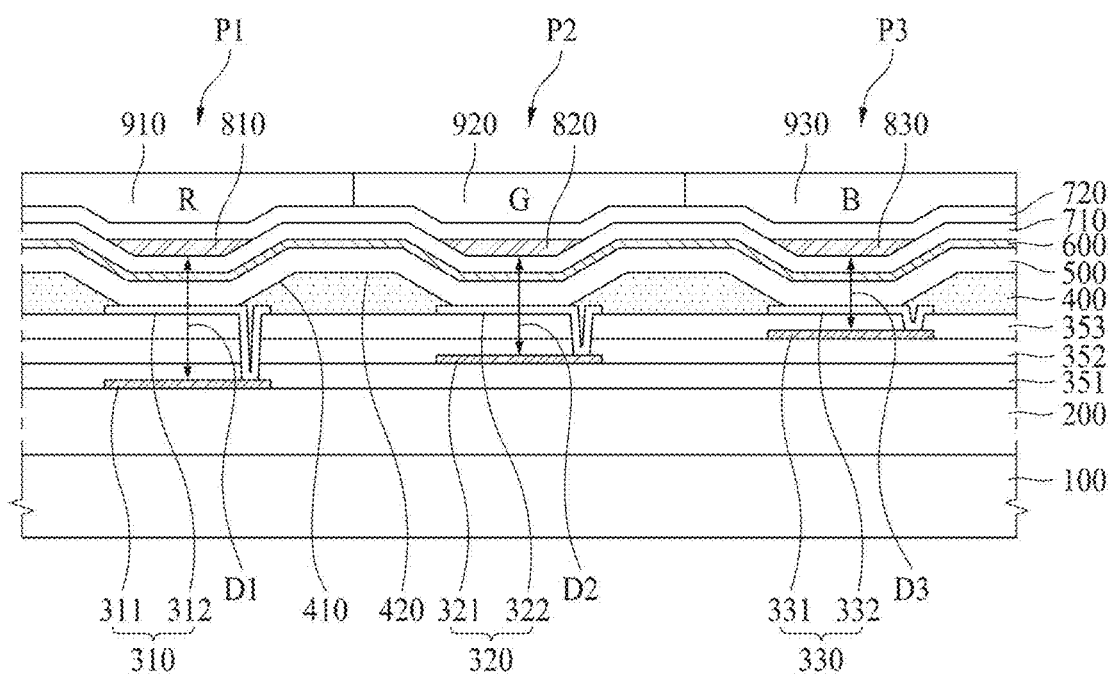
FIG. 4 is a cross-sectional view illustrating an electroluminescent display device according to another embodiment of the present disclosure.

FIG. 4 is a cross-sectional view illustrating an electroluminescent display device according to another embodiment of the present disclosure.

Except for a structure of a reflective electrode 311, 321, and 331 and a structure of a transparent electrode 312, 322 and 332, the electroluminescent display device of FIG. 4 is substantially similar to the electroluminescent display device of FIG. 1. Accordingly, the same reference numbers will be used throughout the drawings to refer to the same or like parts, and only the different structures will be described as follows.

As shown in the example of FIG. 4, in an area of a first subpixel (P1), a first reflective electrode 311 may be formed on a circuit device layer 200, a first insulating interlayer 351 may be formed on the first reflective electrode 311, a second insulating interlayer 352 may be formed on the first insulating interlayer 351, a third insulating interlayer 353 may be formed on the second insulating interlayer 352, and a first transparent electrode 312 may be formed on the third insulating interlayer 353. The first transparent electrode 312 may be electrically connected to the first reflective electrode 311 via a contact hole provided in the first insulating interlayer 351, the second insulating interlayer 352, and the third insulating interlayer 353. However, the first transparent electrode 312 may be directly connected to a source terminal or drain terminal of a driving thin-film transistor provided in the circuit device layer 200, without being electrically connected to the first reflective electrode 311.

In an area of a second subpixel (P2), the first insulating interlayer 351 may be formed on the circuit device layer 200, a second reflective electrode 321 may be formed on the first insulating interlayer 351, the second insulating interlayer 352 may be formed on the second reflective electrode 321, the third insulating interlayer 353 may be formed on the second insulating interlayer 352, and a second transparent electrode 322 may be formed on the third insulating interlayer 353. The second transparent electrode 322 may be electrically connected to the second reflective electrode 321 via a contact hole provided in the second insulating interlayer 352 and the third insulating interlayer 353. However, the second transparent electrode 322 may be directly connected to the source terminal or drain terminal of the driving thin-film transistor provided in the circuit device layer 200, without being electrically connected to the second reflective electrode 321.

In an area of a third subpixel (P3), the first insulating interlayer 351 may be formed on the circuit device layer 200, the second insulating interlayer 352 may be formed on the first insulating interlayer 351, a third reflective electrode 331 may be formed on the second insulating interlayer 352, the third insulating interlayer 353 may be formed on the third reflective electrode 311, and a third transparent electrode 332 may be formed on the third insulating interlayer 353. The third transparent electrode 332 may be electrically connected to the third reflective electrode 331 via a contact hole provided in the third insulating interlayer 353. However, the third transparent electrode 332 may be directly connected to the source terminal or drain terminal of the driving thin-film transistor provided in the circuit device layer 200, without being electrically connected to the third reflective electrode 331.

Thus, according to another embodiment of the present disclosure, the first reflective electrode 311, the second reflective electrode 321, and the third reflective electrode 331 may be formed in different layers, and thus, may be positioned at the different heights so that a first distance (D1) between the first reflective electrode 311 and a first semi-transmissive layer 810, a second distance (D2) between the second reflective electrode 321 and a second semi-transmissive layer 820, and a third distance (D3) between the third reflective electrode 331 and a third semi-transmissive layer 830 may be different from one another. Thus, it may be possible to obtain a micro-cavity effect for each individual subpixel (P1, P2, P3). Although not shown, a structure of semi-transmissive layers 810, 820, and 830 and a structure of encapsulation layers 710 and 720 in the structure of FIG. 4 may be changed to be the same as those of the semi-transmissive layers 810, 820, and 830 and encapsulation layer 710, 720, 730, and 740 in the structure of FIG. 2.

Figure 5:
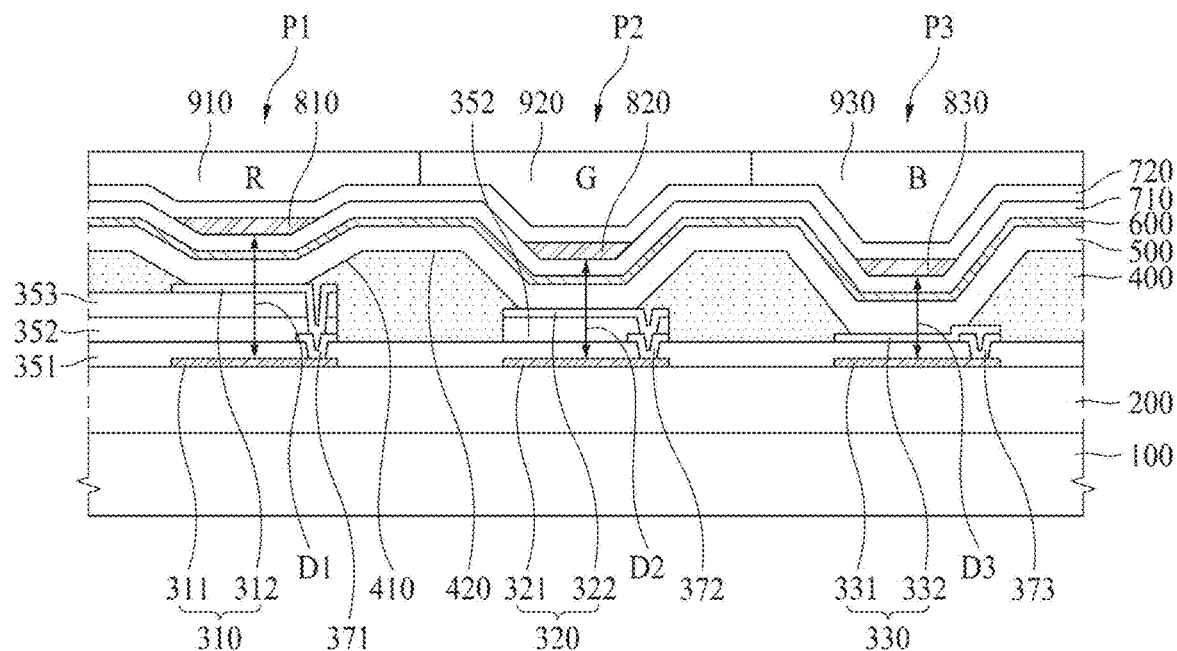
FIG. 5 is a cross-sectional view illustrating an electroluminescent display device according to another embodiment of the present disclosure.

FIG. 5 is a cross-sectional view illustrating an electroluminescent display device according to another embodiment of the present disclosure.

Except for a structure of a reflective electrode 311, 321, and 331 and a structure of a transparent electrode 312, 322 and 332, the electroluminescent display device of FIG. 5 is substantially similar to the electroluminescent display device of FIG. 1. Accordingly, the same reference numbers will be used throughout the drawings to refer to the same or like parts, and only the different structures will be described as follows.

As shown in the example of FIG. 5, in an area of a first subpixel (P1), a first reflective electrode 311 may be formed on a circuit device layer 200, a first insulating interlayer 351 may be formed on the first reflective electrode 311, a first connection electrode 371 may be formed on the first insulating interlayer 351, a second insulating interlayer 352 may be formed on the first connection electrode 371, a third insulating interlayer 353 may be formed on the second insulating interlayer 352, and a first transparent electrode 312 may be formed on the third insulating interlayer 353. The first connection electrode 371 may be electrically connected to the first reflective electrode 311 via a contact hole provided in the first insulating interlayer 351, and the first transparent electrode 312 may be connected to the first connection electrode 371 via a contact hole provided in the second insulating interlayer 352 and the third insulating interlayer 353. However, the first transparent electrode 312 may be directly connected to a source terminal or drain terminal of a driving thin-film transistor provided in the circuit device layer 200, without being electrically connected to the first reflective electrode 311 through the first connection electrode 371. For example, the first connection electrode 371 may be omitted.

In an area of a second subpixel (P2), a second reflective electrode 321 may be formed on the circuit device layer 200, the first insulating interlayer 351 may be formed on the second reflective electrode 321, a second connection electrode 372 may be formed on the first insulating interlayer 351, the second insulating interlayer 352 may be formed on the second connection electrode 372, and a second transparent electrode 332 may be formed on the second insulating interlayer 352. The second connection electrode 372 may be connected to the second reflective electrode 321 via a contact hole provided in the first insulating interlayer 351, and the second transparent electrode 322 may be connected to the second connection electrode 372 via a contact hole provided in the second insulating interlayer 352. However, the second transparent electrode 322 may be directly connected to the source terminal or drain terminal of the driving thin-film transistor provided in the circuit device layer 200, without being electrically connected to the second reflective electrode 321 through the second connection electrode 372. For example, the second connection electrode 372 may be omitted.

In an area of a third subpixel (P3), a third reflective electrode 331 may be formed on the circuit device layer 200, the first insulating interlayer 351 may be formed on the third reflective electrode 331, a third connection electrode 373 may be formed on the first insulating interlayer 351, and a third transparent electrode 332 may be formed on the third connection electrode 373. The third connection electrode 373 may be connected to the third reflective electrode 331 via a contact hole provided in the first insulating interlayer 351, and the third transparent electrode 332 may be directly formed on an upper surface of the third connection electrode 373. However, the third transparent electrode 332 may be directly connected to the third reflective electrode 331 via a contact hole provided in the first insulating interlayer 351. For example, the third connection electrode 373 may be omitted. Also, the third transparent electrode 332 may be directly connected to the source terminal or drain terminal of the driving thin-film transistor provided in the circuit device layer 200, without being electrically connected to the third reflective electrode 331. For example, the third connection electrode 373 may be omitted.

The second insulating interlayer 352 provided in the first subpixel (P1) and the second insulating interlayer 352 provided in the second subpixel (P2) may be spaced apart from each other, and a bank 400 may be provided in the space between the second insulating interlayer 352 provided in the first subpixel (P1) and the second insulating interlayer 352 provided in the second subpixel (P2). The second insulating interlayer 352 may be not provided in the third subpixel (P3). Also, the third insulating interlayer 353 may be not provided in the second subpixel (P2) and the third subpixel (P3).

Thus, according to another embodiment of the present disclosure, the first transparent electrode 312, the second transparent electrode 322, and the third transparent electrode 332 may be formed in different layers, and thus, may be positioned at the different heights so that a first distance (D1) between the first reflective electrode 311 and a first semi-transmissive layer 810, a second distance (D2) between the second reflective electrode 321 and a second semi-transmissive layer 820, and a third distance (D3) between the third reflective electrode 331 and a third semi-transmissive layer 830 may be different from one another. Thus, it may be possible to obtain a micro-cavity effect for each individual subpixel (P1, P2, P3) with relative ease. Although not shown, a structure of semi-transmissive layers 810, 820, and 830 and a structure of encapsulation layers 710 and 720 in the structure of FIG. 5 may be changed to be the same as those of the semi-transmissive layers 810, 820, and 830 and encapsulation layer 710, 720, 730, and 740 in the structure of FIG. 2.

Figure 6:
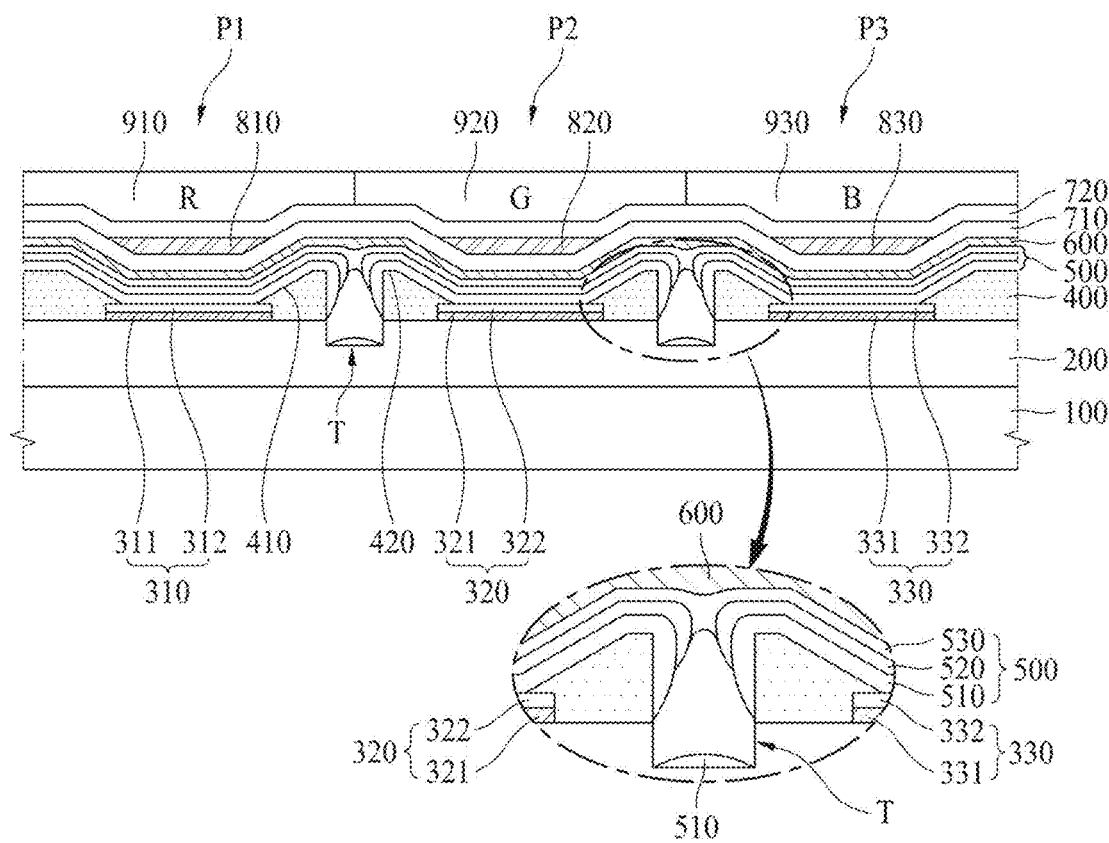
FIG. 6 is a cross-sectional view illustrating an electroluminescent display device according to another embodiment of the present disclosure.

FIG. 6 is a cross-sectional view illustrating an electroluminescent display device according to another embodiment of the present disclosure.

A trench (T) may be additionally provided in the boundary between subpixels (P1, P2, P3) of the electroluminescent display device shown in FIG. 6. Thus, the electroluminescent display device shown in FIG. 6 may be different from the electroluminescent display device shown in FIG. 1. Accordingly, the same reference numbers will be used throughout the drawings to refer to the same or like parts, and only the different structures will be described as follows.

As shown in the example of FIG. 6, a trench (T) may be provided in the boundary between subpixels (P1, P2, P3). The trench (T) may be provided in a bank 400 and a circuit device layer 200. For example, the trench (T) may be provided in some areas of an upper portion of the circuit device layer 200, for example, a planarization layer, while passing through the bank 400. However, the trench (T) is not limited to this structure. For example, the trench (T) may be provided in some areas of an upper portion of the bank 400, without passing through the bank 400.

According to another embodiment of the present disclosure, the trench (T) may be provided in the boundary between subpixels (P1, P2, P3), and an emission layer 500 may be formed in the trench (T). Thus, a long current path may be formed between the neighboring subpixels (P1, P2, P3) to reduce a leakage current from being generated between the neighboring subpixels (P1, P2, P3). For example, on the presumption that an interval between the subpixels (P1, P2, P3) becomes compact to realize a high resolution, when the emission layer 500 inside any one of the subpixels (P1, P2, P3) emits light, charges of the corresponding emission layer 500 may be transferred to another emission layer 500 of neighboring another subpixel (P1, P2, P3), and there may be a possibility of leakage current. Thus, according to another embodiment of the present disclosure, the trench (T) may be formed in the boundary between the subpixels (P1, P2, P3), and the emission layer 500 may be formed in the trench (T) so that a resistance may be increased due to the long current path formed between the neighboring subpixels (P1, P2, P3) to reduce an occurrence of a leakage current.

For example, the emission layer 500 may include a first stack 510, a second stack 530, and a charge generating layer 520 disposed between the first stack 510 and the second stack 530. The first stack 510 may be formed on an inner lateral surface of the trench (T), and may be formed on an inner lower surface of the trench (T). For example, some area of the first stack 510 formed on the inner lateral surface of the trench (T) may be noncontiguous with (e.g., disconnected from) some area of the first stack 510 formed on the inner lower surface of the trench (T). Thus, some area of the first stack formed on one lateral surface inside the trench (T), and for example, on the left lateral surface inside the trench (T) may be noncontiguous with (e.g., not connected to) some area of the first stack formed on the other lateral surface inside the trench (T), and for example, on the right lateral surface inside the trench (T). Accordingly, charges may be not transferred between the subpixels (P1, P2, P3) arranged with the trench (T) interposed in-between through the first stack 510. It should be appreciated that the terms "left" and "right" are used herein for convenience of description, and are interchangeable, as would be understood by one of ordinary skill in the art.

Also, the charge generating layer 520 may be formed on the first stack 510 at the inner lateral surface of trench (T). For example, some area of the charge generating layer 520 formed on one inner lateral surface of the trench (T), and for example, on the left lateral surface inside the trench (T) may be noncontiguous with (e.g., not connected to) some area of the charge generating layer 520 formed on the other inner lateral surface of the trench (T), and for example, on the right lateral surface inside the trench (T). Accordingly, charges may be not transferred between the subpixels (P1, P2, P3) arranged with the trench (T) interposed in-between through the charge generating layer 520.

Also, the second stack 530 may be contiguous (e.g., provided connectedly) between the neighboring subpixels (P1, P2, P3) with the trench (T) interposed in-between on the charge generating layer 520. Thus, charges may be transferred between the subpixels (P1, P2, P3) with the trench (T) interposed in-between through the second stack 530, but embodiments are not limited to this structure. For example, the second stack 530 may be noncontiguous (e.g., provided disconnectedly) between the neighboring subpixels (P1, P2, P3) with the first trench (T1) interposed in-between by appropriately adjusting a shape of the trench (T) and a deposition process of the emission layer 500. For example, some areas of a lower portion of the second stack 530 being adjacent to the charge generating layer 520 may be noncontiguous (e.g., disconnectedly provided) in the boundary area between the subpixels (P1, P2, P3).

Conductivity of the charge generating layer 520 may be higher than that of each of the first stack 510 and the second stack 530. For example, an N-type charge generating layer of the charge generating layer 520 may include a metal material, and conductivity of the charge generating layer 520 may be higher than that of each of the first stack 510 and the second stack 530. Thus, the charge transfer between the subpixels (P1, P2, P3), which may be adjacent to each other, may be generally made through the charge generating layer 520, and the charge transfer through the second stack 530 may be relatively insignificant.

Thus, according to another embodiment of the present disclosure, when the emission layer 500 is formed inside the trench (T), some of the emission layer 500 may be noncontiguous (e.g., disconnectedly provided). For example, the first stack 510 and the charge generating layer 520 may be noncontiguous (e.g., provided disconnectedly) so that it may be possible to reduce the charge transfer between the subpixels (P1, P2, P3), which may be disposed while being adjacent to each other, to reduce or prevent a leakage current.

Figure 7A:
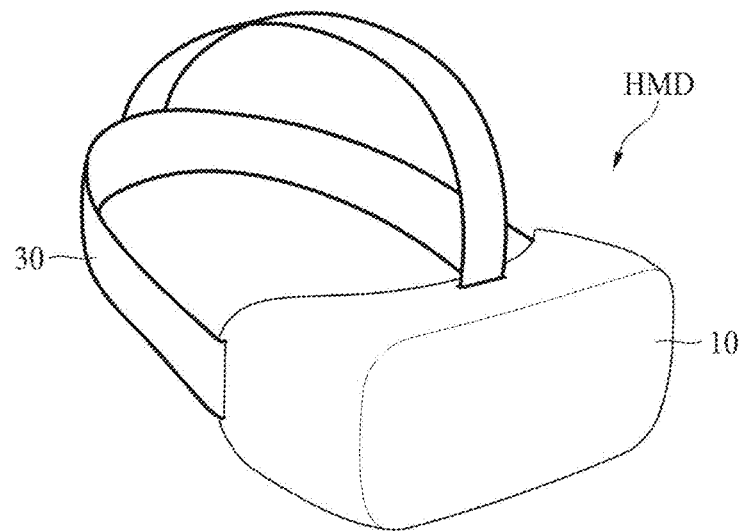
FIGS. 7A to 7C illustrate an electroluminescent display device according to another embodiment of the present disclosure, and relate to a head-mounted display (HMD) device.
Figure 7B:
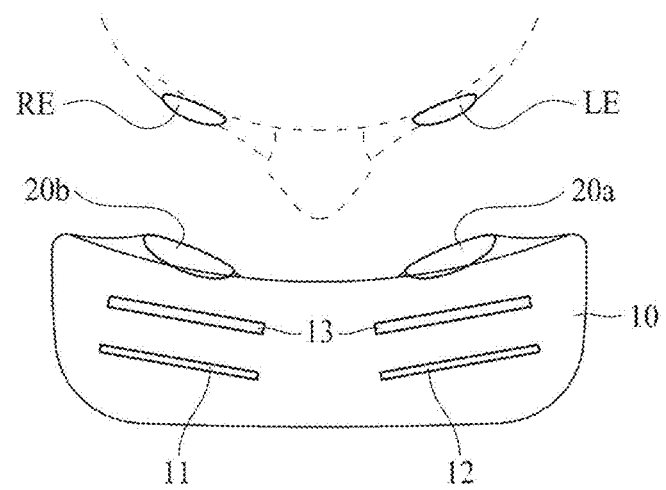
Figure 7C:
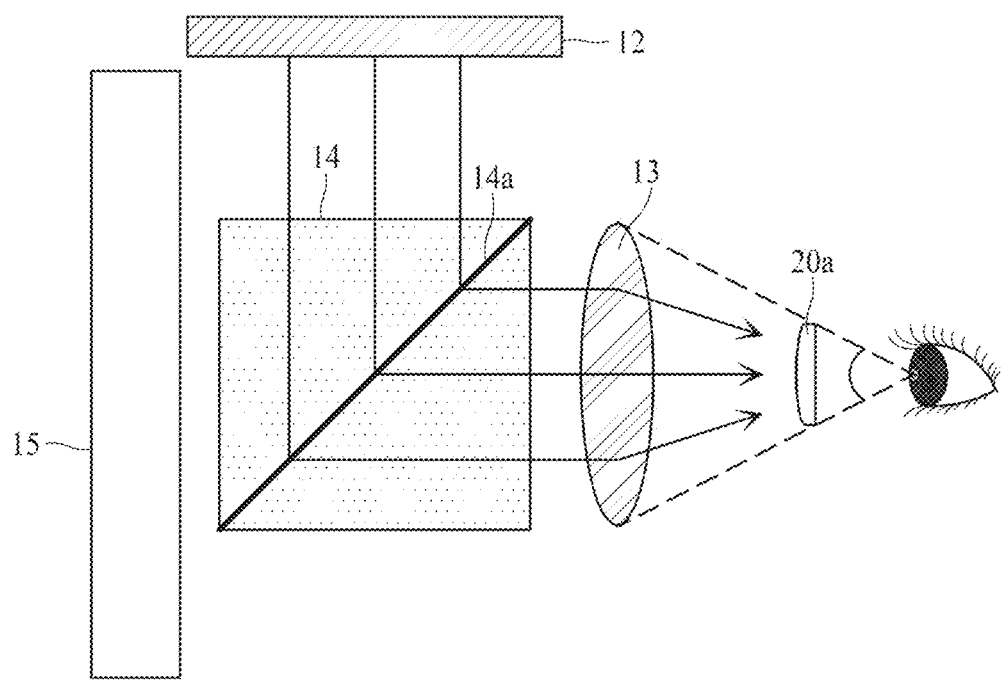

FIGS. 7A to 7C illustrate an electroluminescent display device according to another embodiment of the present disclosure, and relate to a head-mounted display (HMD) device.

FIG. 7A is a perspective view. FIG. 7B is a plan view of a virtual reality (VR) structure. FIG. 7C is a cross-sectional view of an augmented reality (AR) structure.

As shown in the example of FIG. 7A, the head-mounted display (HMD) device according to the present disclosure may include a receiving case 10 and a head mounted band 30. A display device, a lens array, and an ocular eyepiece may be received or accommodated in the inside of the receiving case 10.

The head mounted band 30 may be fixed to the receiving case 10. Although the head mounted band 30 is illustrated as being configured to surround an upper surface and both lateral surfaces in a user's head, but embodiments are not limited to this structure. For example, the head mounted band may be provided to fix the head-mounted display (HMD) device to a user's head. The head mounted band may be substituted with an eyeglass-frame shape or a helmet-shaped structure.

As shown in the example of FIG. 7B, the head-mounted display (HMD) device of the virtual reality (VR) structure according to the present disclosure may include a left-eye display device 12, a right-eye display device 11, a lens array 13, a left-eye ocular eyepiece 20a, and a right-eye ocular eyepiece 20b. The left-eye display device 12, the right-eye display device 11, the lens array 13, and the left-eye ocular eyepiece 20a, and the right-eye ocular eyepiece 20b may be received or accommodated in the aforementioned receiving case 10.

The same image may be displayed on the left-eye display device 12 and the right-eye display device 11. For example, a user can view a two-dimensional (2D) image. When an image for a left eye is displayed on the left-eye display device 12, and an image for a right eye may be displayed on the right-eye display device 11, a user can view a three-dimensional (3D) image. Each of the left-eye display device 12 and the right-eye display device 11 may be formed of the aforementioned display device according to the embodiments of the present disclosure. For example, an upper portion corresponding to a surface for displaying an image in the aforementioned display device according to the embodiments of the present disclosure, for example, the color filter layer 910, 920, and 930, may face the lens array 13.

The lens array 13 may be disposed between the left-eye ocular eyepiece 20a and the left-eye display device 12, while being apart from each of the left-eye ocular eyepiece 20a and the left-eye display device 12. For example, the lens array 13 may be positioned at the front of the left-eye ocular eyepiece 20a and at the rear of the left-eye display device 12. Also, the lens array 13 may be disposed between the right-eye ocular eyepiece 20b and the right-eye display device 11, while being apart from each of the right-eye ocular eyepiece 20b and the right-eye display device 11. For example, the lens array 13 may be positioned at the front of the right-eye ocular eyepiece 20b and at the rear of the right-eye display device 11.

The lens array 13 may be a micro lens array. The lens array 13 may be substituted with a pin hole array. Due to the lens array 13, an image displayed on the left-eye display device 12 or the right-eye display device 11 may be expanded and perceived by a user.

A user's left eye (LE) may be positioned at the left-eye ocular eyepiece 20a. A user's right eye (RE) may be positioned at the right-eye ocular eyepiece 20b.

As shown in the example of FIG. 7C, the head-mounted display (HMD) device of the augmented reality (AR) structure according to the present disclosure may include a left-eye display device 12, a lens array 13, a left-eye ocular eyepiece 20a, a transmissive reflecting portion 14, and a transmission window 15. FIG. 7C shows only the left-eye structure, for convenience of explanation. The right-eye structure may be substantially similar in structure to the left-eye structure.

The left-eye display device 12, the lens array 13, the left-eye ocular eyepiece 20a, the transmissive reflecting portion 14 and the transmission window 15 may be received or accommodated in the aforementioned receiving case 10. The left-eye display device 12 may be disposed at one side of the transmissive reflecting portion 14, for example, an upper side of the transmissive reflecting portion 14, without covering the transmission window 15. Accordingly, an image may be provided to the transmissive reflecting portion 14, such that an ambient background seen through the transmission window 15 may not be covered by the left-eye display device 12.

The left-eye display device 12 may be formed of the aforementioned various electroluminescent display devices according to the embodiments of the present disclosure. For example, an upper portion corresponding to a surface for displaying an image in the aforementioned various electroluminescent display devices according to the embodiments of the present disclosure, for example, the color filter layer 910, 920, and 930, may face the transmissive reflecting portion 14.

The lens array 13 may be provided between the left-eye ocular eyepiece 20a and the transmissive reflecting portion 14. A user's left eye may be positioned at the left-eye ocular eyepiece 20a.

The transmissive reflecting portion 14 may be disposed between the lens array 13 and the transmission window 15. The transmissive reflecting portion 14 may include a reflection surface 14a, which may partially transmit some light, and may also reflect the remaining light. The reflection surface 14a may be configured to guide an image, which may be displayed on the left-eye display device 12, toward the lens array 13. Thus, a user can view an image displayed on the left-eye display device 12, together with the ambient background through the transmission window 15. For example, a user can view one image obtained by a virtual image overlaid with the ambient real background, to thereby realize an augmented reality (AR). The transmission window 15 may be disposed in front of the transmissive reflecting portion 14.

In the above embodiments of the present disclosure, the emission layer 500 may be configured to emit white light, but embodiments are not limited thereto. For example, the emission layer 500 may be configured to emit different colored light for each subpixel (P1, P2, P3).

It will be apparent to those skilled in the art that various modifications and variations may be made in the present disclosure without departing from the technical idea or scope of the disclosure. Thus, it is intended that embodiments of the present disclosure cover the modifications and variations of the disclosure provided they come within the scope of the appended claims and their equivalents.

What is claimed is:

1. An electroluminescent display device, comprising:
a substrate;
a first subpixel on the substrate;
a second subpixel on the substrate;
a third subpixel on the substrate;
a respective first electrode in each of the first to third subpixels;
an emission layer on the first electrodes, the emission layer comprising:
a first stack;
a second stack; and
a charge generating layer disposed between the first stack and the second stack;
a common second electrode on the emission layer;
an encapsulation layer comprising:
a first encapsulation layer on the second electrode; and
a second encapsulation layer on the first encapsulation layer;
a first semi-transmissive layer between the first encapsulation layer and the second encapsulation layer, the first semi-transmissive layer overlapping the first electrode of the first subpixel; and
a bank in a boundary area between each of the first subpixel, the second subpixel, and the third subpixel,
wherein a trench is provided inside the bank,
wherein the first stack and the charge generating layer are noncontiguous in the trench, and
wherein the second stack is continuously provided over the trench.

2. The electroluminescent display device of claim 1, wherein:
the first electrode of the first subpixel comprises:
a first reflective electrode; and
a first transparent electrode on the first reflective electrode; and
the second electrode comprises a transparent electrode.

3. The electroluminescent display device of claim 1, wherein the first encapsulation layer and the second encapsulation layer directly contact each other in a boundary area between the first subpixel and the second subpixel.

4. The electroluminescent display device of claim 1, wherein:
the bank covers a periphery of the first electrode; and
the first semi-transmissive layer does not overlap a highest surface of the bank.

5. The electroluminescent display device of claim 1, wherein:
the bank covers a periphery of the first electrode; and
a lateral surface of the bank is inclined such that an angle between the lateral surface of the bank and an upper surface of the substrate is within a range of 30° to 80°.

6. The electroluminescent display device of claim 1, further comprising:
a second semi-transmissive layer overlapping the first electrode of the second subpixel, the second semi-transmissive layer being on the second electrode; and
a third semi-transmissive layer overlapping the first electrode of the third subpixel, the third semi-transmissive layer being on the second electrode.

7. The electroluminescent display device of claim 6, wherein the second semi-transmissive layer and the third semi-transmissive layer are between the first encapsulation layer and the second encapsulation layer.

8. The electroluminescent display device of claim 6, wherein the second semi-transmissive layer and the third semi-transmissive layer are at different positions from a position of the first semi-transmissive layer.

9. The electroluminescent display device of claim 1, further comprising:
a lens array spaced apart from the substrate; and
a receiving case configured to receive the substrate and the lens array therein.

10. An electroluminescent display device comprising:
a substrate;
a first subpixel on the substrate;
a second subpixel on the substrate; and
a third subpixel on the substrate;
a first reflective electrode provided in the first subpixel;
a second reflective electrode in the second subpixel on the substrate;
a third reflective electrode in the third subpixel on the substrate;
an emission layer on the first reflective electrode, the second reflective electrode, and the third reflective electrode, the emission layer comprising:
a first stack;
a second stack; and
a charge generating layer disposed between the first stack and the second stack;
a transparent electrode on the emission layer;
a plurality of encapsulation layers on the transparent electrode;
a first semi-transmissive layer between any two among the plurality of encapsulation layers, the first semi-transmissive layer overlapping the first reflective electrode;
a second semi-transmissive layer between any two among the plurality of encapsulation layers, the second semi-transmissive layer overlapping the second reflective electrode;
a third semi-transmissive layer between any two among the plurality of encapsulation layers, the third semi-transmissive layer overlapping the third reflective electrode; and
a bank in a boundary area between each of the first subpixel, the second subpixel, and the third subpixel,
wherein a trench is provided inside the bank,
wherein the first stack and the charge generating layer are noncontiguous in the trench, and
wherein the second stack is continuously provided over the trench.

11. The electroluminescent display device of claim 10, wherein the plurality of encapsulation layers directly contact each other in the boundary area between each of the first subpixel, the second subpixel, and the third subpixel.

12. The electroluminescent display device of claim 10, wherein the first semi-transmissive layer, the second semi-transmissive layer, and the third semi-transmissive layer are spaced apart from one another.

* * * * *